United States Patent
Yang et al.

(10) Patent No.: US 8,921,171 B2
(45) Date of Patent: Dec. 30, 2014

(54) METHOD FOR FORMING GATE STRUCTURE, METHOD FOR FORMING SEMICONDUCTOR DEVICE, AND SEMICONDUCTOR DEVICE

(75) Inventors: Hong Yang, Beijing (CN); Xueli Ma, Beijing (CN); Wenwu Wang, Beijing (CN); Kai Han, Beijing (CN); Xiaolei Wang, Beijing (CN); Huaxiang Yin, Beijing (CN); Jiang Yan, Newburg, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 195 days.

(21) Appl. No.: 13/699,734

(22) PCT Filed: Jul. 24, 2012

(86) PCT No.: PCT/CN2012/079093
§ 371 (c)(1),
(2), (4) Date: Nov. 25, 2012

(87) PCT Pub. No.: WO2014/012266
PCT Pub. Date: Jan. 23, 2014

(65) Prior Publication Data
US 2014/0015063 A1 Jan. 16, 2014

(30) Foreign Application Priority Data
Jul. 16, 2012 (CN) .......................... 2012 1 02465872
Jul. 24, 2012 (WO) ................ PCT/CN2012/079093

(51) Int. Cl.
*H01L 21/8238* (2006.01)
*H01L 27/092* (2006.01)
(52) U.S. Cl.
CPC .......... *H01L 21/8238* (2013.01); *H01L 27/092* (2013.01); *H01L 21/823842* (2013.01); *H01L 21/823857* (2013.01)

USPC ........... 438/183; 438/233; 438/199; 257/369; 257/E27.084; 257/E27.06

(58) Field of Classification Search
USPC .......... 438/183, 233, 199; 257/369, E27.084, 257/E27.06
See application file for complete search history.

(56) References Cited

U.S. PATENT DOCUMENTS

| 8,530,294 B2 * | 9/2013 | Lee et al. ...................... 438/199 |
| 2010/0052070 A1 * | 3/2010 | Chung et al. .................. 257/369 |
| 2010/0148280 A1 | 6/2010 | Mitsuhashi |
| 2010/0276760 A1 | 11/2010 | Tsuchiya |
| 2012/0032281 A1 | 2/2012 | Haneda |

FOREIGN PATENT DOCUMENTS

CN 102104042 6/2011

* cited by examiner

*Primary Examiner* — Cathy N Lam
(74) *Attorney, Agent, or Firm* — Goodwin Procter LLP

(57) ABSTRACT

A method for forming a gate structure, comprising: providing a substrate, where the substrate includes a nMOSFET area and a pMOSFET area, each of the nMOSFET area and the pMOSFET area has a gate trench, and each of the gate trenches is provided at a bottom portion with a gate dielectric layer; forming a gate dielectric capping layer on the substrate; forming an etching stop layer on the gate dielectric capping layer; forming an oxygen scavenging element layer on the etching stop layer; forming a first work function adjustment layer on the oxygen scavenging element layer; etching the first work function adjustment layer above the nMOSFET area; forming a second work function adjustment layer on the surface of the substrate; metal layer depositing and annealing to fill the gate trenches with a metal layer; and removing the metal layer outside the gate trenches.

12 Claims, 4 Drawing Sheets

METHOD FOR FORMING GATE STRUCTURE, METHOD FOR FORMING SEMICONDUCTOR DEVICE, AND SEMICONDUCTOR DEVICE

This application is the national phase application of International Application No. PCT/CN2012/079093, entitled "METHOD FOR FORMING GATE STRUCTURE, METHOD FOR FORMING SEMICONDUCTOR DEVICE, AND SEMICONDUCTOR DEVICE," filed on Jul. 24, 2012, which claims priority to Chinese Patent Application No. 201210246572.9, entitled "METHOD FOR FORMING GATE STRUCTURE, METHOD FOR FORMING SEMICONDUCTOR DEVICE, AND SEMICONDUCTOR DEVICE," filed on Jul. 16, 2012. Both the Chinese and PCT applications are hereby incorporated by reference in their entireties.

FIELD OF THE INVENTION

The present disclosure relates to the field of semiconductor technique, and in particular to a method for forming a gate structure, a method for forming a semiconductor device, and a semiconductor device.

BACKGROUND OF THE INVENTION

With rapid development of semiconductor technology, feature sizes of Complementary Metal-Oxide-Semiconductor (CMOS) devices in very large scale integrated circuits are constantly reducing as predicted by Moore Law, and traditional polysilicon gates and silicon dioxide gate dielectrics are facing many technical challenges. For example, starting from the 45 nm technology node and beyond, the silicon dioxide gate dielectric layer has a thickness of several atomic layers, which will incur sharp rises of gate leakage current and power consumption. In addition, the polysilicon gate electrode causes a polysilicon depletion effect and problems such as a too high gate resistance and the like. To this end, high dielectric constant (high-k) gate dielectric and metal gate electrode, which may be introduced to effectively solve these problems associated with CMOS devices, have been successfully applied to the 32 nm technology by Intel Corporation, USA.

However, introduction of high-k gate dielectric/metal gate structure brings some new problems. For example, during the growth of high-k gate dielectric, a silicon dioxide interface inevitably exists between the high-k gate dielectric and the surface of semiconductor substrate. Generally, the interface layer in the high-k gate dielectric/metal gate process has a thickness of about 0.5 to 0.7 nm. However, once CMOS devices enter the 32 nm technology node or beyond, the equivalent gate oxide thickness of the high-k gate dielectric is not more than 0.7 nm or even highly-demanded, and the thickness of the interface layer will be increased during a high temperature annealing in the subsequent process. Therefore, it becomes a difficulty and focus in the art to reduce equivalent oxide thickness of the high-k gate dielectric by optimizing process conditions and/or materials.

SUMMARY OF THE INVENTION

In view of the above problems, the present invention provides a new method for manufacturing CMOS, which can effectively decrease the equivalent gate oxide thickness.

According to an embodiment of the present disclosure, a method for forming a gate structure is provided, which includes:

providing a substrate, where the substrate includes a nMOSFET area and a pMOSFET area, each of the nMOSFET area and the pMOSFET area includes a gate trench, and each of the gate trenches is provided at a bottom portion with a gate dielectric layer;

forming a gate dielectric capping layer on a surface of the substrate;

forming an etching stop layer on the gate dielectric capping layer;

forming an oxygen scavenging element layer on the etching stop layer;

forming a first work function adjustment layer on the oxygen scavenging element layer;

etching the first work function adjustment layer above the nMOSFET area until the etching stop layer is exposed;

forming a second work function adjustment layer on the surface of the substrate;

performing metal layer deposition and annealing process to fill the gate trenches with a metal layer; and removing the metal layer outside the gate trenches.

According to an embodiment of the present disclosure, a method for forming a gate structure is provided, which includes:

providing a substrate, where the substrate includes a nMOSFET area and a pMOSFET area, each of the nMOSFET area and the pMOSFET area includes a gate trench, and each of the gate trenches is provided at a bottom portion with a gate dielectric layer;

forming a gate dielectric capping layer on a surface of the substrate;

forming an etching stop layer on the gate dielectric capping layer;

forming an oxygen scavenging element layer on the etching stop layer;

forming a second work function adjustment layer on the oxygen scavenging element layer;

etching the second work function adjustment layer above the pMOSFET area until the etching stop layer is exposed;

forming a first work function adjustment layer on the surface of the substrate;

performing metal layer deposition and annealing process to fill the gate trenches with a metal layer; and removing the metal layer outside the gate trenches.

According to an embodiment of the present disclosure, a method for forming a semiconductor device is provided, which includes:

providing a substrate, where the substrate includes a nMOSFET area and a pMOSFET area, each of the nMOSFET area and the pMOSFET area includes a gate trench, and each of the gate trenches is provided at a bottom portion with a gate dielectric layer; and forming a gate structure on a surface of the substrate using the above mentioned method.

According to an embodiment of the present disclosure, a semiconductor device is provided, which includes:

a substrate, where the substrate includes a nMOSFET area and a pMOSFET area;

a second gate structure formed above the nMOSFET area, where the second gate structure includes: a gate dielectric capping layer; an etching stop layer above the gate dielectric capping layer; a second work function adjustment layer above the etching stop layer; and a metal layer above the second work function adjustment layer; and a first gate structure formed above the pMOSFET area, where the first gate structure includes: a gate dielectric capping layer; an etching stop layer above the gate dielectric capping layer; an oxygen scavenging element layer above the etching stop layer; a first work function adjustment layer above the oxygen scavenging element layer; a second work function adjustment layer above the first work function adjustment layer; and a metal layer above the second work function adjustment layer.

According to an embodiment of the present disclosure, a semiconductor device is provided, which includes:

a substrate, where the substrate includes a nMOSFET area and a pMOSFET area;

a second gate structure formed above the nMOSFET area, where the second gate structure includes: a gate dielectric capping layer; an etching stop layer above the gate dielectric capping layer; an oxygen scavenging element layer above the etching stop layer; a second work function adjustment layer above the oxygen scavenging element layer; a first work function adjustment layer above the second work function adjustment layer; and a metal layer above the first work function adjustment layer; and a first gate structure formed above the pMOSFET area, where the first gate structure includes: a gate dielectric capping layer; an etching stop layer above the gate dielectric capping layer; a first work function adjustment layer above the etching stop layer; and a metal layer above the first work function adjustment layer.

According to the methods for forming the gate structures provided by the embodiments of the present disclosure, by introducing an oxygen scavenging element layer above the gate dielectric layer, oxygen outside is isolated from entering into the interface layer below the gate dielectric layer and oxygen in the interface layer is scavenged during a subsequent high temperature annealing process, so the equivalent gate oxide thickness is effectively decreased. The influence on the equivalent work function of the metal gate by the oxygen scavenging element layer can be weakened by the work function adjustment layer above the oxygen scavenging element layer, so the difficulty of adjusting the equivalent work function is decreased. The gate dielectric capping layer between the gate dielectric layer and the oxygen scavenging element layer can barrier the metal diffusion of the metal gate and prevent the oxygen scavenging element from entering into the gate dielectric layer, therefore, problems of a too high gate leakage current and poor reliability are avoided.

Moreover, in the process of etching the work function adjustment layer above the nMOSFET area or the pMOSFET area, the etching is stopped at the etching stop layer by selecting an appropriate method, and thus the oxygen scavenging element layer is removed. In this way, the influence on the work function of the metal gate in the nMOSFET area or the pMOSFET area by the oxygen scavenging element layer can be avoided, and thus a problem of an increased difficulty for adjusting the equivalent work function caused by the introduction of the oxygen scavenging element is avoided.

In addition, the methods for forming the gate structures provided by embodiments of the present disclosure are compatible with the mainstream back-gate process, possess good process stability and repeatability, and can be applied to large scale production.

BRIEF DESCRIPTION OF THE DRAWINGS

The above and other objects, features and advantages will become apparent with reference to the description of embodiments of the present disclosure in conjunction with drawings.

Throughout the drawings, the same or similar reference numbers represent the same or similar structures or steps.

DETAILED DESCRIPTION OF THE INVENTION

Figure 1:
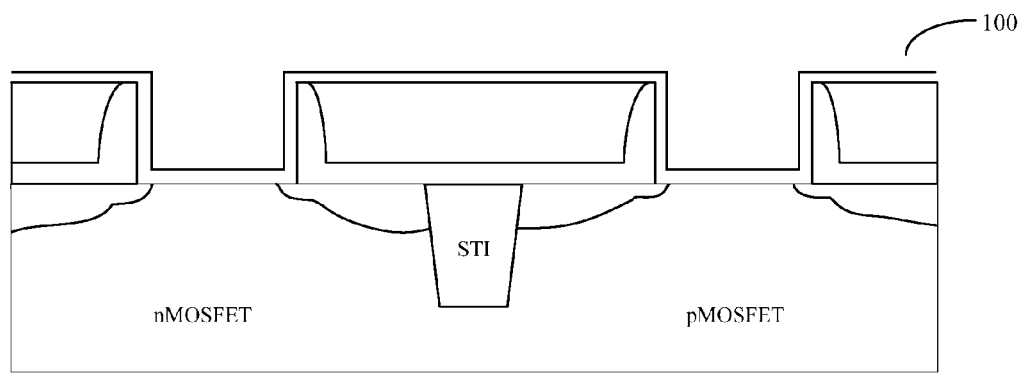
FIGS. 1-8 are schematic diagrams showing each of the intermediate structures in a method for forming a gate structure according to an embodiment of the present disclosure.

It is studied that "oxygen scavenging process" is one of effective approaches for reducing equivalent oxide thickness of high-k gate dielectric. The main principle is that Gibbs free energy of certain metals or other unsaturated oxygenated dielectric materials is much larger than that of the semiconductor substrate, i.e. oxides of these metals or saturated oxygenates of the unsaturated oxygenated dielectrics are more stable and easier to be formed than the oxide of the semiconductor substrate. Therefore, some metal films or other unsaturated oxygenated dielectric films can be added into the gate dielectric structure, and by means of a high temperature annealing process, the oxygen element in the interface layer between the high-k gate dielectric and the semiconductor substrate can be scavenged away, so that the interface layer is thinned or even eliminated, thus reducing the equivalent gate oxide thickness of the gate dielectric layer.

However, due to the introduction of the oxygen scavenging process, the oxygen scavenging element may enter into the high k gate dielectric layer, which will cause a over-high gate leakage current and increase the difficulty for adjusting the equivalent work function of the metal gate. In addition, there are also problems such as poor reliability and the like caused by the thinned interface layer.

According to the methods for forming the gate structures provided by the embodiments of the present disclosure, by introducing an oxygen scavenging element layer above the gate dielectric layer, oxygen outside is isolated from entering into the interface layer below the gate dielectric layer and oxygen in the interface layer is scavenged during a subsequent high temperature annealing process, so the equivalent gate oxide thickness is effectively decreased. The influence on the equivalent work function of the metal gate by the oxygen scavenging element layer can be weakened by the work function adjustment layer above the oxygen scavenging element layer, so the difficulty of adjusting the equivalent work function is decreased. The gate dielectric capping layer between the gate dielectric layer and the oxygen scavenging element layer can barrier the metal diffusion of the metal gate and prevent the oxygen scavenging element from entering into the gate dielectric layer, therefore, problems of a too high gate leakage current and poor reliability are avoided.

Moreover, in the process of etching the work function adjustment layer above the n-type metal oxide semiconductor field effect transistor (nMOSFET) area or the p-type metal oxide semiconductor field effect transistor (pMOSFET) area, the etching is stopped at the etching stop layer by selecting an appropriate method, and thus the oxygen scavenging element layer is removed. In this way, the influence on the work function of the metal gate of the nMOSFET area or the pMOSFET area by the oxygen scavenging element layer can be avoided, and thus a problem of an increased difficulty for adjusting the equivalent work function caused by the introduction of the oxygen scavenging element is avoided.

Specific embodiments of the present invention are described below in conjunction with drawings.

To facilitate the sufficient understanding of the invention, many details are set forth in the following description. However, the present invention may be implemented in other manners than those described herein, and similar extensions can be made by those skilled in the art without deviating from the scope of the present invention. Therefore the present invention is not limited to the embodiments disclosed hereinafter.

When describing the embodiments of the present invention, for convenience of illustration, sectional views showing the structure of the device are enlarged partially and are not drawn to scale. The drawings are exemplary and are not intended to limit the protection scope of the invention.

It should be noted that the reference in the structures or steps that a first feature is "on" or "above" a second feature includes the case that the first and the second features are in direct contact and the case that additional features are present between the first and the second features, i.e., the first and the second feature may be not in direct contact.

An embodiment of the present disclosure provides a semiconductor device, which includes:

a substrate, where the substrate includes a nMOSFET area and a pMOSFET area;

a second gate structure formed above the nMOSFET area, where the second gate structure includes: a gate dielectric capping layer; an etching stop layer above the gate dielectric capping layer; a second work function adjustment layer above the etching stop layer; and a metal layer above the second work function adjustment layer; and a first gate structure formed above the pMOSFET area, where the first gate structure includes: a gate dielectric capping layer; an etching stop layer above the gate dielectric capping layer; an oxygen scavenging element layer above the etching stop layer; a first work function adjustment layer above the oxygen scavenging element layer; a second work function adjustment layer above the first work function adjustment layer; and a metal layer above the second work function adjustment layer.

Another embodiment of the present disclosure provides a semiconductor device, which includes:

a substrate, where the substrate includes a nMOSFET area and a pMOSFET area;

a second gate structure formed above the nMOSFET area, where the second gate structure includes: a gate dielectric capping layer; an etching stop layer above the gate dielectric capping layer; an oxygen scavenging element layer above the etching stop layer; a second work function adjustment layer above the oxygen scavenging element layer; a first work function adjustment layer above the second work function adjustment layer; and a metal layer above the first work function adjustment layer; and a first gate structure formed above the pMOSFET area, where the first gate structure includes: a gate dielectric capping layer; an etching stop layer above the gate dielectric capping layer; a first work function adjustment layer above the etching stop layer; and a metal layer above the first work function adjustment layer.

Optionally, a thickness of the gate dielectric capping layer is 5 angstroms to 5 nanometers. Optionally, a material of the gate dielectric capping layer is titanium nitride. Optionally, a thickness of the oxygen scavenging element layer is 5 angstroms to 50 angstroms. Optionally, a material of the oxygen scavenging element layer is titanium.

In order to understand the structures of the above semiconductor devices more clearly, embodiments of the present disclosure also provide methods for forming the gate structures of the semiconductor devices described above. It should be noted that the following steps are merely illustrative and do not constitute a limitation to the present invention.

FIGS. 1-8 illustrate a method for forming a gate structure according to an embodiment of the present disclosure. The method includes the following steps:

Step S11: providing a substrate 100, where the substrate 100 includes a nMOSFET area and a pMOSFET area, each of the nMOSFET area and the pMOSFET area has a gate trench, and each of the gate trenches is provided at a bottom portion with a gate dielectric layer, as shown in FIG. 1.

As an example, the substrate 100 may be formed by the following steps:

Step S11-1: forming a shallow trench isolation (STI) structure in the semiconductor substrate.

Specifically, the material of the semiconductor substrate may be single crystal silicon (Si), single crystal germanium (Ge), germanium silicon (GeSi), gallium arsenic (GaAs), indium phosphide (InP), gallium indium arsenic (GaInAs) or silicon carbide (SiC); and may also be silicon-on-insulator (SOI). The semiconductor substrate may include a N-well, a P-well or the both.

The semiconductor substrate is divided into the nMOSFET area and the pMOSFET area by the shallow trench isolation structure.

Step S11-2: depositing an interface layer, a gate dielectric layer and a gate layer sequentially on the semiconductor substrate.

Optionally, the material of the interface layer is silicon oxide, and the thickness of the interface layer is about 4 Å to 1 nm. The material of the interface layer may also be other oxides of silicon such as SiOxNy. Optionally, the material of the gate dielectric layer is $HfO_2$, and the thickness of the gate dielectric layer is about 15 Å to 40 Å. The material of the gate dielectric layer may also be other high K dielectrics such as other hf-based oxides, Hf-based multi-component oxides or thulium-based multi-component oxides, for example, HfAlON, HfLaON, HfSiON, $CeO_2$-$HfO_2$ compound or $LaLuO_3$. The material of the gate layer may be polysilicon or other materials. The gate layer may have a stack structure.

Step S11-3: forming a mask having a gate pattern on the gate layer, and etching with the mask to form a gate structure.

Specifically, the gate structure includes a dummy gate, as well as an etched gate dielectric layer and an etched interface layer.

Step S11-4: forming side walls on two wings of the gate structure, and performing ion implantation by taking the gate structure and the side walls as masks to form a source/drain area.

Specifically, the side walls may have a signal layer structure, a double-layer structure or a multiple-layer structure; the source/drain area may include a source/drain lightly doped (LDD) structure.

Step S11-5: depositing a pre-metal dielectric layer, and performing chemical mechanical polishing (CMP) until the dummy gate is exposed.

Specifically, the material of the pre-metal dielectric layer may be silicon oxide glass or silicon nitride ($Si_3N_4$); and may also be one or combination of PSG, BSG, FSG or other low K dielectrics. The process of CMP may include two steps, the first step is to remove the redundant pre-metal dielectric layer, and the second step is to remove the masks.

Step S11-6: performing etching to remove the dummy gate.

Specifically, the etching may be stopped at the gate dielectric layer, and may also be stopped at the semiconductor substrate.

It should be noted that in the case that the etching is stopped at the semiconductor substrate, a new gate dielectric layer is formed before the next step. Specifically, the gate dielectric lay may be formed by atomic layer deposition (ALD), physical vapor deposition (PVD) or chemical vapor deposition (CVD).

To this point, the nMOSFET area and the pMOSFET area, the gate trenches in the nMOSFET area and the pMOSFET area, and the gate dielectric layer at the bottom of the gate trenches are formed.

Figure 2:
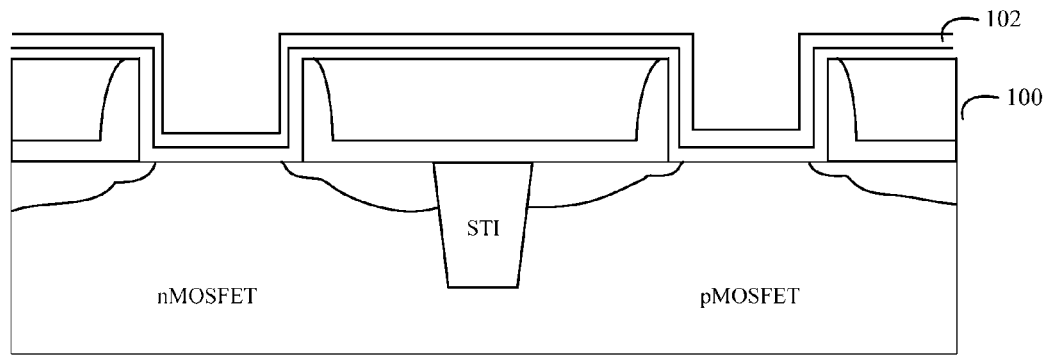

Step S12: forming a gate dielectric capping layer 102 on the surface of the substrate 100, as shown in FIG. 2.

Specifically, the gate dielectric capping layer 102 may be formed on the surface of the substrate 100 by ALD, PVD, CVD, metal organic compound chemical vapor deposition (MOCVD) or plasma enhanced atomic layer deposition (PEALD). Preferably, the thickness of the gate dielectric capping layer 102 is about 5 Å to 5 nm. Preferably, the material of the gate dielectric capping layer 102 is TiN. The material of the gate dielectric capping layer 102 may also be other metal compounds such as TaN.

Figure 3:
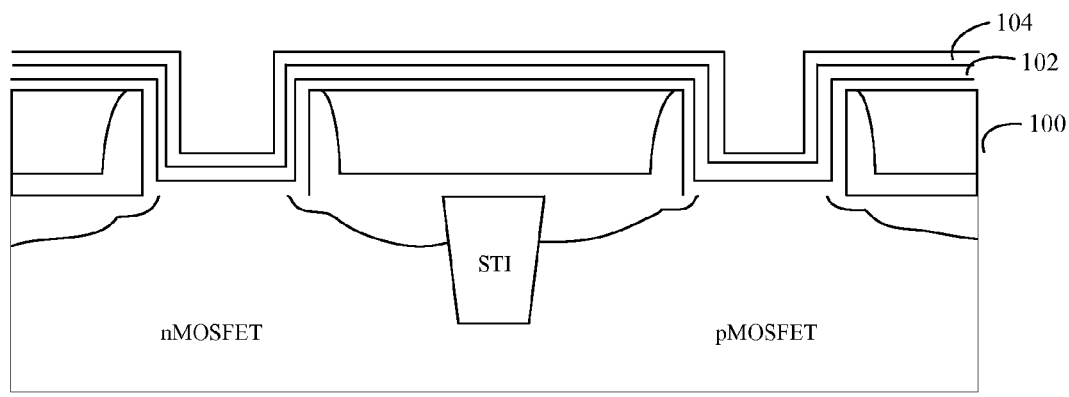

Step S13: forming an etching stop layer 104 on the gate dielectric capping layer 102, as shown in FIG. 3.

Preferably, the thickness of the etching stop layer 104 is about 1 nm to 8 nm. Preferably, the material of the etching stop layer 104 is TaN. The material of the etching stop layer 104 may also be other metal compounds such as TiN.

Figure 4:
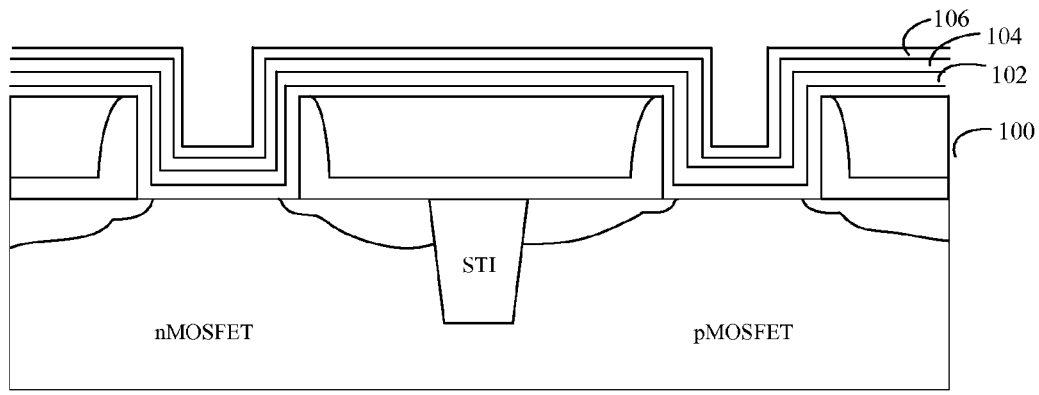

Step S14: forming an oxygen scavenging element layer 106 on the etching stop layer 104, as shown in FIG. 4.

Preferably, the thickness of the oxygen scavenging element layer 106 is about 5 Å to 50 Å. Preferably, the material of the oxygen scavenging element layer 106 is Ti. The material of the oxygen scavenging element layer 106 may also be other metals such as Al.

Step S15: forming a work function adjustment layer.

Figure 5:
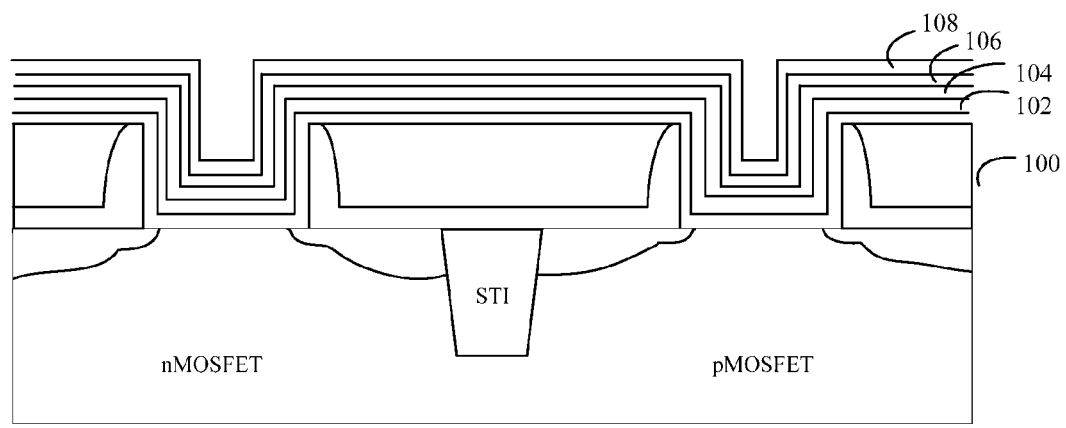

In the present embodiment, forming the work function adjustment layer further includes:

Step S15-1: forming a first work function adjustment layer 108 on the oxygen scavenging element layer 106, as shown in FIG. 5.

The first work function adjustment layer 108 is used for adjusting the work function of the metal gate in the pMOSFET area. Preferably, the thickness of the first work function adjustment layer 108 is about 2 nm to 20 nm. Preferably, the material of the first work function adjustment layer 108 is TiN. The material of the first work function adjustment layer 108 may also be metals such as Ti, or metal compounds.

Figure 6:
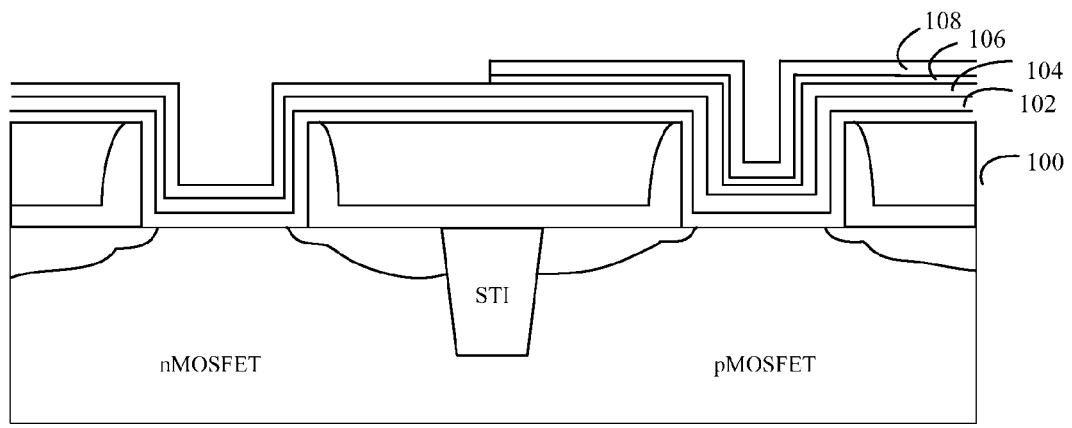

Step S15-2: etching the first work function adjustment layer 108 above the nMOSFET area until the etching stop layer 104 is exposed, as shown in FIG. 6.

Specifically, the pMOSFET area may be protected with photoresist, and the oxygen scavenging element layer 306 above the nMOSFET area is removed by etching. Then the photoresist is removed.

Figure 7:
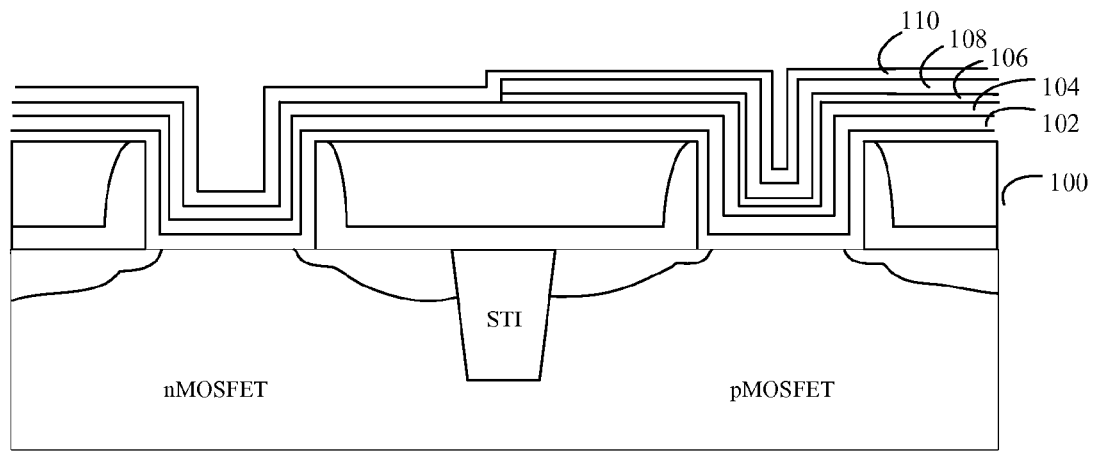

Step S15-3: forming a second work function adjustment layer 110 on the surface of the substrate, as shown in FIG. 7.

The second work function adjustment layer 110 is used for adjusting the work function of the metal gate in the nMOSFET area. Preferably, the thickness of the second work function adjustment layer 110 is about 2 nm to 20 nm. Preferably, the material of the second work function adjustment layer 110 is TiAl. The material of the second work function adjustment layer 110 may also be metal compounds such as TaN, or the second work function adjustment layer 110 may be in a sandwich structure of metals, such as Ti/Al/Ti.

Figure 8:
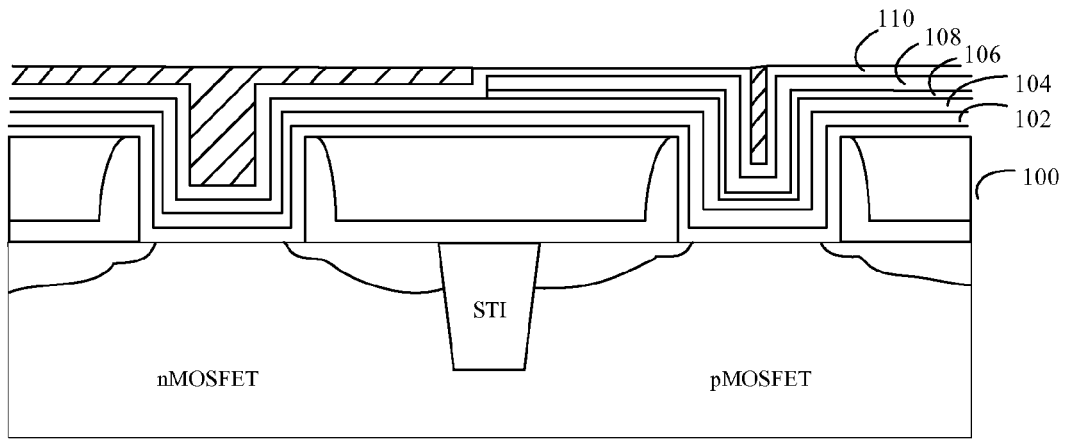

Step S16: performing metal layer deposition and annealing process to fill the gate trenches with a metal layer 112, as shown in FIG. 8.

Specifically, the metal layer deposition may be performed by ALD, PVD, CVD, MOCVD or PEALD. Preferably, the material of the metal layer 112 is Al. The material of the metal layer 112 may also be metal materials such as TiAl or W.

Step S17: removing the metal layer 112 outside the gate trenches.

Specifically, the metal layer 112 outside the gate trenches may be removed by CMP.

To this point, the gate structure and the corresponding semiconductor device formed according to the embodiment of the present disclosure are obtained.

In the process of etching the work function adjustment layer above the nMOSFET area, the etching may be stopped at the etching stop layer by selecting an appropriate method, and thus the oxygen scavenging element layer is removed. In this way, the influence on the work function of the metal gate in the nMOSFET area by the oxygen scavenging element layer can be avoided, and a problem of an increased difficulty for adjusting the work function caused by the introduction of the oxygen scavenging element is avoided. In other embodiments, the oxygen scavenging element layer above the pMOSFET area may be removed first. Specifically, forming the work function adjustment layer may include: forming a second work function adjustment layer 110 on the oxygen scavenging element layer 106, etching the second work function adjustment layer 110 above the pMOSFET area until the etching stop layer 104 is exposed; and forming a first work function adjustment layer 108 on the surface of the substrate.

In addition, the semiconductor device formed according the embodiment of the present disclosure has a partially-asymmetric gate structure, which is benefit to form certain areas having a special requirement for the gate leakage current and the reliability in an integration circuit. For example, an I/O area generally requires a thick interface layer to control the gate leakage current and the reliability, and the thickness of the interface layer may be increased by removing the oxygen scavenging metal layer in this area.

Although the embodiments of the present disclosure are described in detail in conjunction with the drawings, those skilled in the art can understand that the above embodiments are only used for illustrating the present invention, and do not intend to limit the present invention. Those skilled in the art can also understand that there may be various changes, substitutes and transformations of the present invention without departing from the scope defined by the appending claims. Therefore, the scope of the present invention is only limited by the appending claims and the equivalents thereof.

What is claimed is:

1. A method for forming a gate structure, comprising:
providing a substrate, wherein the substrate comprises a nMOSFET area and a pMOSFET area, each of the nMOSFET area and the pMOSFET area has a gate trench, and each of the gate trenches is provided at a bottom portion with a gate dielectric layer;
forming a gate dielectric capping layer on a surface of the substrate;
forming an etching stop layer on the gate dielectric capping layer;
forming an oxygen scavenging element layer on the etching stop layer;
forming a first work function adjustment layer on the oxygen scavenging element layer;
etching the first work function adjustment layer above the nMOSFET area until the etching stop layer is exposed;
forming a second work function adjustment layer on the surface of the substrate;
performing metal layer deposition and annealing process to fill the gate trenches with a metal layer; and
removing the metal layer outside the gate trenches.

2. The method according to claim 1, wherein the gate dielectric capping layer has a thickness of 5 angstroms to 5 nanometers.

3. The method according to claim 1, wherein the gate dielectric capping layer has a material of TiN.

4. The method according to claim 1, wherein the oxygen scavenging element layer has a thickness of 5 angstroms to 50 angstroms.

5. The method according to claim 1, wherein the oxygen scavenging element layer has a material of Ti.

6. A method for forming a gate structure, comprising:
  providing a substrate, wherein the substrate comprises a nMOSFET area and a pMOSFET area, each of the nMOSFET area and the pMOSFET area has a gate trench, and each of the gate trenches is provided at a bottom portion with a gate dielectric layer;
  forming a gate dielectric capping layer on a surface of the substrate;
  forming an etching stop layer on the gate dielectric capping layer;
  forming an oxygen scavenging element layer on the etching stop layer;
  forming a second work function adjustment layer on the oxygen scavenging element layer;
  etching the second work function adjustment layer above the pMOSFET area until the etching stop layer is exposed;
  forming a first work function adjustment layer on the surface of the substrate;
  performing metal layer deposition and annealing process to fill the gate trenches with a metal layer; and
  removing the metal layer outside the gate trenches.

7. The method according to claim 6, wherein the gate dielectric capping layer has a thickness of 5 angstroms to 5 nanometers.

8. The method according to claim 6, wherein the gate dielectric capping layer has a material of TiN.

9. The method according to claim 6, wherein the oxygen scavenging element layer has a thickness of 5 angstroms to 50 angstroms.

10. The method according to claim 6, wherein the oxygen scavenging element layer has a material of Ti.

11. A method for forming a semiconductor device, comprising:
  providing a substrate, wherein the substrate comprises a nMOSFET area and a pMOSFET area, each of the nMOSFET area and the pMOSFET area has a gate trench, and each of the gate trenches is provided at a bottom portion with a gate dielectric layer; and
  forming a gate structure on a surface of the substrate, comprising:
    forming a gate dielectric capping layer on the surface of the substrate;
    forming an etching stop layer on the gate dielectric capping layer;
    forming an oxygen scavenging element layer on the etching stop layer;
    forming a first work function adjustment layer on the oxygen scavenging element layer;
    etching the first work function adjustment layer above the nMOSFET area until the etching stop layer is exposed;
    forming a second work function adjustment layer on the surface of the substrate;
    performing metal layer deposition and annealing process to fill the gate trenches with a metal layer; and
    removing the metal layer outside the gate trenches.

12. A method for forming a semiconductor device, comprising:
  providing a substrate, wherein the substrate comprises a nMOSFET area and a pMOSFET area, each of the nMOSFET area and the pMOSFET area has a gate trench, and each of the gate trenches is provided at a bottom portion with a gate dielectric layer; and
  forming a gate structure on a surface of the substrate, comprising:
    forming a gate dielectric capping layer on the surface of the substrate;
    forming an etching stop layer on the gate dielectric capping layer;
    forming an oxygen scavenging element layer on the etching stop layer;
    forming a second work function adjustment layer on the oxygen scavenging element layer;
    etching the second work function adjustment layer above the pMOSFET area until the etching stop layer is exposed;
    forming a first work function adjustment layer on the surface of the substrate;
    performing metal layer deposition and annealing process to fill the gate trenches with a metal layer; and
    removing the metal layer outside the gate trenches.

* * * * *